US010644683B2

(12) United States Patent
Chen et al.

(10) Patent No.: US 10,644,683 B2
(45) Date of Patent: May 5, 2020

(54) CLOCK DRIVING CIRCUIT RESISTANT TO SINGLE-EVENT TRANSIENT

(71) Applicant: NATIONAL UNIVERSITY OF DEFENSE TECHNOLOGY, Hunan (CN)

(72) Inventors: Shuming Chen, Hunan (CN); Peipei Hao, Hunan (CN); Pengcheng Huang, Hunan (CN); Bin Liang, Hunan (CN)

(73) Assignee: NATIONAL UNIVERSITY OF DEFENSE TECHNOLOGY, Hunan (CN)

( * ) Notice: Subject to any disclaimer, the term of this patent is extended or adjusted under 35 U.S.C. 154(b) by 0 days.

(21) Appl. No.: 16/088,450

(22) PCT Filed: Mar. 28, 2017

(86) PCT No.: PCT/CN2017/078383
§ 371 (c)(1),
(2) Date: Sep. 26, 2018

(87) PCT Pub. No.: WO2017/167170
PCT Pub. Date: Oct. 5, 2017

(65) Prior Publication Data
US 2019/0089340 A1 Mar. 21, 2019

(30) Foreign Application Priority Data
Mar. 31, 2016 (CN) .......................... 2016 1 0196746

(51) Int. Cl.
*H03K 5/133* (2014.01)
*H03K 19/003* (2006.01)
(52) U.S. Cl.
CPC .......... *H03K 5/133* (2013.01); *H03K 19/003* (2013.01); *H03K 19/00323* (2013.01); *H03K 19/00384* (2013.01)

(58) Field of Classification Search
CPC ............ H03K 19/003; H03K 19/0033; H03K 19/00338; H03K 5/13; H03K 5/134; H03K 5/135; H03K 5/133
See application file for complete search history.

(56) References Cited

U.S. PATENT DOCUMENTS 7,262,642 B2 * 8/2007 Abe ...................... H03K 5/082
327/108
7,741,877 B2 * 6/2010 Roche ...................... G06F 1/10
326/13
(Continued)

FOREIGN PATENT DOCUMENTS

| CN | 104348450 | 2/2015 |
| CN | 105141291 | 12/2015 |
| CN | 105897243 | 8/2016 |

OTHER PUBLICATIONS

Aahlad Mallajosyula and Payman Zarkesh-Ha, "A Robust Single Event Upset Hardened Clock Distribution Network", 2008 IEEE International Integrated Reliability Workshop Final Report, Oct. 2008, pp. 121-124.

(Continued)

*Primary Examiner* — Hai L Nguyen
(74) *Attorney, Agent, or Firm* — JCIPRNET

(57) ABSTRACT

Disclosed in present invention is a clock driving circuit resistant to single-event transient. The clock driving circuit resistant to single-event transient consists of two kinds of inverters: double-input double-output (DIDO) inverter and double-input single-output (DISO) inverter, the specific number of the two kinds of inverters used, and the connection way thereof are determined by the complexity of a designed circuit and a clock design method used by the designed circuit. The DIDO inverter and DISO inverter both comprise two PMOS transistors and two NMOS transistors. In a clock distribution network based on double-input (Continued)

double-output and double-input single-output clock inverters, the probability that single-event transient pulses generated on the DIDO inverter are propagated to clock leaf nodes is zero. Therefore, the invention effectively reducing the probability that the clock distribution network generates single-event transient pulses on the respective clock leaf nodes after being bombarded by radiation particles.

2 Claims, 6 Drawing Sheets

(56) References Cited

U.S. PATENT DOCUMENTS

2007/0205813 A1    9/2007  Hjelm
2009/0261865 A1*  10/2009  Pasqualini ..... H03K 19/018521
                                                              327/108

OTHER PUBLICATIONS

"International Search Report (Form PCT/ISA/210)", dated Jul. 4, 2017, with English translation thereof, pp. 1-4.

* cited by examiner

CLOCK DRIVING CIRCUIT RESISTANT TO SINGLE-EVENT TRANSIENT

CROSS-REFERENCE TO RELATED APPLICATION

This application is a 371 application of an international PCT application serial no. PCT/CN2017/078383, filed on Mar. 28, 2017, which claims priority to and the benefit of China Patent Application No. CN 201610196746.3, filed on Mar. 31, 2016. The entirety of each of the abovementioned patent applications is hereby incorporated by reference herein and made a part of this specification.

TECHNICAL FIELD

The present invention relates to the field of clock reinforcement, in particular to a clock driving circuit resistant to single-event transient (SET).

BACKGROUND

Electronic systems applied to aerospace are susceptible to single-event effects (SEEs) and fail, and the influence of SEEs on electronic devices in aerospace equipment is increasing as the feature sizes of integrated circuits continue to reduce, so the SEEs have become a main failure mode in large-scale integrated circuits for aerospace.

As one of the SEEs, SET usually refers to a phenomenon that circuit nodes have instant current and voltage changes as a semiconductor device is bombarded by spatial single particles, the energy of the particles is deposited to cause collisional ionization of the particles, and the ionized charges are collected and transported under the action of a concentration gradient and an electric field.

As signals distributed most widely in synchronous digital systems and having highest frequencies, clock signals play an important role in integrated circuits. A clock distribution network (CDN), as a carrier of the clock signals, consists of multiple clock nodes. The clock nodes will produce soft errors after being bombarded by radiation particles, which, if serious, will result in failure of a circuit (even the whole chip). Therefore, the importance of the CDN is naturally self-evident. At present, the soft error ratio (SER) caused by upset of clock nodes is seldom studied in the industry, and CDN reinforcement methods are rarely seen in the literature.

In order to achieve the objectives of low power consumption and low skew, people have been constantly researching and exploring the structure of the CDN. Currently common CDN structures include tree clock networks (balance trees, H trees, X trees, etc.), mesh clock networks, fishbone clock networks, and hybrid clock networks. In addition, novel clock distribution networks such as resonant clock distribution networks have emerged. No matter in which clock distribution network with a topological structure, clock buffers/inverters are essential parts. As a basis of clock distribution, the clock buffers play a leading role in providing pure and accurate clock signals: they provide more flexibility to designers, allowing designers to align clock edges or move clocks forward or backward, so as to enlarge data valid windows; and at the same time, they can compensate for line length delays and provide unique chip timing to help engineers to design best circuits.

The influence of single-event effects induced by heavy ions, protons, neutrons and the like on the clock networks is mainly embodied in two special modes of circuit failure: radiation-induced clock race (also called clock glitches) and radiation-induced clock jitter. The radiation-induced clock race indicates that the collected charges cause the clock to hop to an error state so as to introduce a new clock edge, and this phenomenon will lead to error sampling of data in an edge-sensitive circuit. The radiation-induced clock jitter indicates that, when the charge collection caused by radiation particles approaches the clock edge, the clock edge deviates from its expected hopping time, causing an increase in clock jitter. The research results of N. Seifert et al. show that in an unreinforced, pulse-latch-based clock distribution network design, the Clock SER accounts for 50% of the entire chip-level SER; and in a trigger-based design, the SER caused by the radiation-induced clock race accounts for the vast majority of all clock path SERs (the SER caused by the radiation-induced clock jitter accounts for 2% of the total clock path SER).

The resistance of the clock distribution network to the single-event effects can be directly characterized by the number of transient pulses captured on each leaf node of the CDN, the width of the transient pulses and the like, and can also be indirectly characterized by the number of error sampling of a timing unit caused by transient pulses on clock signals in the design.

A single event upset driving circuit for clock leaf nodes based on an improved Muller C-element was proposed in A Robust Single Event Upset Hardened Clock Distribution Network (Oct. 12 to 16, 2008, P 121-124) published by A. Mallajosyula and P. Zarkesh-Ha in the IEEE International Integrated Reliability Workshop Final Report. This technique filters out single-event transient pulses propagated on the clock path by introducing a delay unit in a driving unit for clock leaf nodes and using a time-redundant reinforcement method. This will produce an additional delay, and at the same time, the width of the single-event transient pulses that can be filtered out by the driving circuit completely depends on the delay unit introduced. In addition, this technique can only be used for the reinforcement of the leaf node driving unit in the clock distribution network.

SUMMARY OF THE INVENTION

The technical problem to be solved by the present invention is: in view of the problems that the single event upset clock driving circuit in the existing clock distribution network has a large delay, and the width of the single-event transient pulses that can be filtered out completely depends on the delay unit introduced, a clock driving circuit resistant to single-event transient is provided, which can significantly improve the ability of the clock distribution network to resist single-event transient, and effectively reduce the probability that the clock distribution network generates single-event transient pulses on the respective clock leaf nodes after being bombarded by radiation particles.

The clock driving circuit resistant to single-event transient proposed by the present invention is composed of two types of inverters: dual inputs and dual outputs (DIDO) inverters, and dual inputs and single output (DISO) inverters. The specific number of the two types of inverters used, and the connection way thereof are determined by the complexity of a designed circuit and a clock design scheme (including a topological structure of a clock distribution network, etc.) used by the designed circuit.

Compared with a common unreinforced inverter, the DIDO inverter proposed in the present invention includes two input ports I1_D, I2_D and two output ports ZN1_D, ZN2_D. The DISO inverter includes two input ports I1_S, I2_S and one output port ZN_S.

Compared with a common inverter composed of a PMOS transistor and an NMOS transistor, the DIDO inverter of the present invention includes two PMOS transistors denoted by a first PMOS transistor and a second PMOS transistor, and two NMOS transistors denoted by a first NMOS transistor and a second NMOS transistor. A gate Pg1_D of the first PMOS transistor is connected to the input port I1_D of the DIDO inverter, a source Ps1_D is connected to a power supply VDD, and a drain Pd1_D is connected to the output port ZN1_D of the DIDO inverter; a gate Pg2_D of the second PMOS transistor is connected to the input port I2_D of the DIDO inverter, a source Ps2_D is connected to the power supply VDD, and a drain Pd2_D is connected to the output port ZN2_D of the DIDO inverter; a gate Ng1_D of the first NMOS transistor is connected to the input port I2_D of the DIDO inverter, a source Ng1_D is connected to the ground VSS, and a drain Nd1_D is connected to the output port ZN1_D of the DIDO inverter; and a gate Ng2_D of the second NMOS transistor is connected to the input port I1_D of the DIDO inverter, a source Ns2_D is connected to the ground VSS, and a drain Nd2_D is connected to the output port ZN2_D of the DIDO inverter.

The DISO inverter of the present invention also includes two PMOS transistors denoted by a third PMOS transistor and a fourth PMOS transistor, and two NMOS transistors denoted by a third NMOS transistor and a fourth NMOS transistor. A gate Pg3_S of the third PMOS transistor is connected to the input port I1_S of the DISO inverter, a source Ps3_S is connected to the power supply VDD, and a drain Pd3_S is connected to a source Ps4_S of the fourth PMOS transistor; a gate Pg4_S of the fourth PMOS transistor is connected to the input port I2_S of the DISO inverter, the source Ps4_S is connected to the drain Pd3_S of the third PMOS transistor, and a drain Pd4_S is connected to the output port ZN_S of the DISO inverter; a gate Ng3_S of the third NMOS transistor is connected to the input port I2_S of the DISO inverter, a source Ns3_S is connected to a drain Nd4_S of the fourth NMOS transistor, and a drain Nd3_S is connected to the output port ZN_S of the DISO inverter; and a gate Ng4_S of the fourth NMOS transistor is connected to the input port I1_S of the DISO inverter, a source Ns4_S is connected to the ground VSS, and the drain Nd4_S is connected to the source Ns3_S of the third NMOS transistor.

FIG. 5 is a schematic diagram of a reinforced clock circuit resistant to single-event transient, implemented using DIDO and DISO units. In this embodiment, the clock driving circuit of the present invention is a clock network of a balanced tree structure composed of n levels of inverters. The Level 1 inverter to the Level (n−1) inverter are DIDO inverters, and the last level inverter, i.e., the Level n inverter, is a DISO inverter, wherein n is an integer, and the value of n is determined by the complexity of a designed circuit and a clock design scheme (including a topological structure of a clock distribution network) used by the designed circuit, and n is larger than or equal to 3. The two input ports of the Level 1 inverter are connected to the same clock signal clk, the output port ZN1_D_1 thereof is connected to the input ports I1_D_21 and I1_D_22 of the Level 2 inverter (in the Figure, two Level 2 inverters are connected as an example), and the output port ZN2_D_1 of the Level 1 inverter is connected to the input ports I2_D_21 and I2_D_22 of the Level 2 inverter; the output ports ZN1_D_21 and ZN1_D_22 of the two Level 2 inverters are respectively connected to the input ports D_31, D_32 and I1_D_33, I1_D_34 of the corresponding Level 3 inverters thereafter, and the output ports ZN2_D_21 and ZN2_D_22 thereof are connected to the input ports I2_D_31, I2_D_32 and I2_D_33, I2_D_34 of the third-stage inverters respectively. The output port ZN1_D_kj of the Level k inverter is connected to the input port I1_D (k+1)j of the subsequent level inverter (i.e., the Level (k+1) inverter), and the output port ZN2_D_kj of the Level k inverter is connected to the input port I2_D_(k+1)j of the Level (k+1) inverter, wherein k and j are integers, 3≥k≥n−2, and 1≥j≥4. The last level inverter (i.e., the clock inverter directly connected to a timing unit such as a trigger, the Level n inverter) in the clock circuit is a DISO clock inverter: the two inputs ports I1_S_j and I2_S_j thereof are respectively connected to the output ports ZN1_D (n−1)j and ZN2_D_(n−1)j of the penultimate level inverter (i.e., the Level (n−1) inverter), and the output port ZN_S_j thereof is connected to a clock input port of a timing unit such as a trigger connected.

The working process of the clock driving circuit against resistant to single-event transient according to the present invention is as follows:

The specific application of the clock driving circuit resistant to single-event transient according to the present invention is illustrated by using a clock distribution network resistant to single-event transient with an n-level balanced tree structure shown in FIG. 5 as an example. Assuming that the clock input clk is zero, the first PMOS transistor in the first DIDO inverter of the Level 2 inverters is bombarded by radiation particles to generate a single-event transient pulse. The transient pulse can be propagated to the gate Pg1_D of the first PMOS transistor and the gate Ng2_D of the second NMOS transistor in the Level 3 inverter, causing the first PMOS transistor of the Level 3 inverter to be turned off; and at the same time, the second NMOS transistor is turned on. Since the output ZN2_D of the first inverter in Level 2 is on a normal low level, the second PMOS transistor of each inverter in Level 3 is turned on. Thus, the second PMOS transistor and the second NMOS transistor of each inverter in Level 3 are turned on at the same time, the output port ZN2_D of the Level 3 inverter is pulled from a normal high level (power voltage value) to an intermediate level (a voltage value between 0 and the power voltage value, the specific voltage value is determined according to the ratio of parasitic resistances on the second PMOS transistor and the second NMOS transistor in the DIDO inverter), then, a transition from a VDD to a certain intermediate level occurs at the output port ZN2_D of the Level 3 inverter, and a transient pulse smaller than a rail-to-rail is generated (while the output port ZN1_D of the inverter in Level 3 is on a normal high level).

Similarly, a transient pulse signal on the output port ZN2_D of the Level 3 inverter will be gradually propagated backwards along a clock path, and the amplitude of the transient pulse will continue to attenuate during propagation. Eventually, the transient pulse will disappear and will not be propagated to the subsequent timing unit.

In the worst case, a SET pulse still exists when the transient pulse is propagated to the last level clock inverter (i.e., a DISO inverter), assuming that a SET pulse is propagated to the input port I2_D of the DISO inverter. According to the transmission characteristics of the DISO inverter in this design, the output will be upset only when the two input ports I1_S and I2_S thereof are the same. Thus, even if a SET pulse is propagated to one input port of the DISO inverter, the SET pulse signal is also filtered out by the DISO inverter (i.e., no SET pulse is generated on the output port ZN_S of the DISO inverter), thereby ensuring the correctness of the clock signal propagated to the subsequent timing unit.

The present invention can achieve the following technical effects:

The reinforced clock circuit resistant to single-event transient according to the present invention is superior to a conventional unreinforced clock circuit in single-event transient resistance. In a clock distribution network based on DIDO and DISO clock inverters, the probability that single-event transient pulses generated on the DIDO inverter are propagated to clock leaf nodes is zero. Therefore, the present invention significantly improves the ability of the clock distribution network to resist single-event transient, and effectively reduces the probability that the clock distribution network generates single-event transient pulses on the respective clock leaf nodes after being bombarded by radiation particles.

DETAILED DESCRIPTION OF EMBODIMENTS

Figure 1:
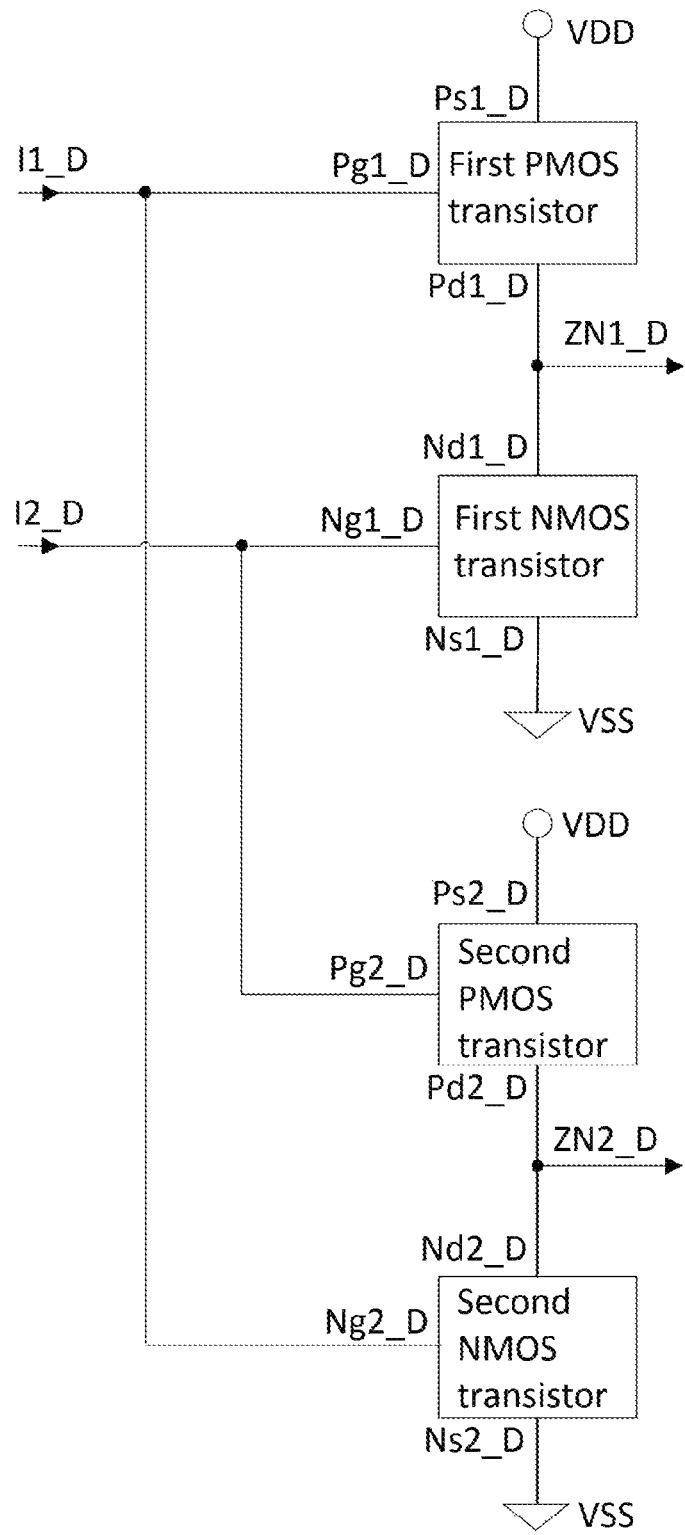
FIG. 1 is a logical structure diagram of a DIDO inverter according to the present invention.

FIG. 1 is a logical structure diagram of a DIDO inverter according to the present invention. Compared with a common inverter composed of a PMOS transistor and an NMOS transistor, the DIDO inverter of the present invention includes two PMOS transistors denoted by a first PMOS transistor and a second PMOS transistor, and two NMOS transistors denoted by a first NMOS transistor and a second NMOS transistor. A gate Pg1_D of the first PMOS transistor is connected to an input port I1_D of the DIDO inverter, a source Ps1_D is connected to a power supply VDD, and a drain Pd1_D is connected to an output port ZN1_D of the DIDO inverter; a gate Pg2_D of the second PMOS transistor is connected to an input port I2_D of the DIDO inverter, a source Ps2_D is connected to the power supply VDD, and a drain Pd2_D is connected to an output port ZN2_D of the DIDO inverter; a gate Ng1_D of the first NMOS transistor is connected to an input port I2_D of the DIDO inverter, a source Ns1_D is connected to the ground VSS, and a drain Nd1_D is connected to the output port ZN1_D of the DIDO inverter; and a gate Ng2_D of the second NMOS transistor is connected to the input port I1_D of the DIDO inverter, a source Ns2_D is connected to the ground VSS, and a drain Nd2_D is connected to the output port ZN2_D of the DIDO inverter.

Figure 2:
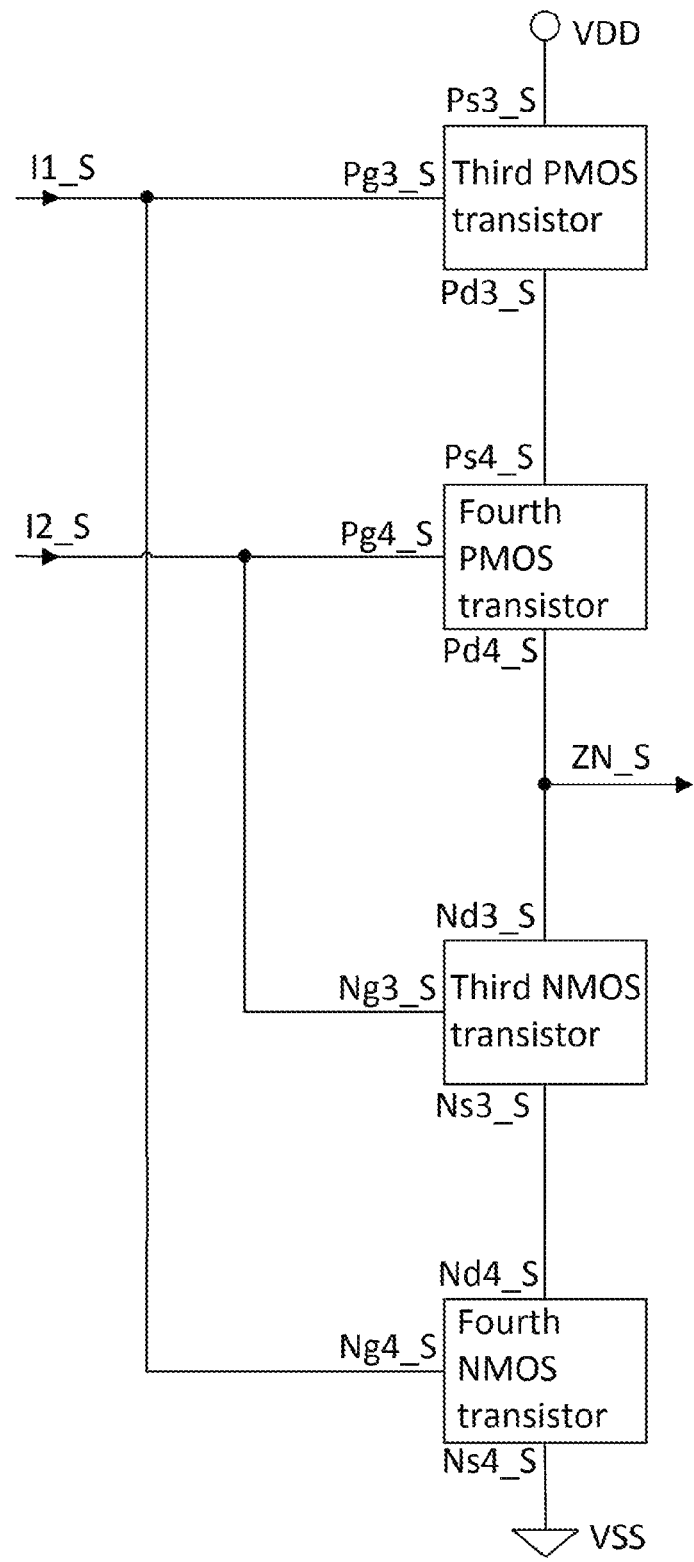
FIG. 2 is a logical structure diagram of a DISO inverter according to the present invention.

FIG. 2 is a logical structure diagram of a DIDO inverter according to the present invention. The DISO inverter of the present invention includes two PMOS transistors denoted by a third PMOS transistor and a fourth PMOS transistor, and two NMOS transistors denoted by a third NMOS transistor and a fourth NMOS transistor. A gate Pg3_S of the third PMOS transistor is connected to an input port I1_S of the DISO inverter, a source Ps3_S is connected to the power supply VDD, and a drain Pd3_S is connected to a source Ps4_S of the fourth PMOS transistor; a gate Pg4_S of the fourth PMOS transistor is connected to an input port I2_S of the DISO inverter, the source Ps4_S is connected to the drain Pd3_S of the third PMOS transistor, and a drain Pd4_S is connected to an output port ZN_S of the DISO inverter; a gate Ng3_S of the third NMOS transistor is connected to an input port I2_S of the DISO inverter, a source Ns3_S is connected to a drain Nd4_S of the fourth NMOS transistor, and a drain Nd3_S is connected to the output port ZN_S of the DISO inverter; and a gate Ng4_S of the fourth NMOS transistor is connected to the input port I1_S of the DISO inverter, a source Ns4_S is connected to the ground VSS, and the drain Nd4_S is connected to the source Ns3_S of the third NMOS transistor.

Figure 3:
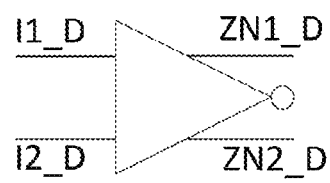
FIG. 3 is a graphical diagram of the DIDO inverter according to the present invention.
Figure 4:
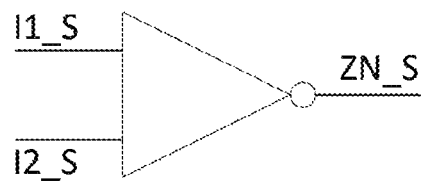
FIG. 4 is a graphical diagram of the DISO inverter according to the present invention.

FIG. 3 shows a graphical diagram of the DIDO inverter according to the present invention. FIG. 4 shows a graphical diagram of the DISO inverter according to the present invention. The graphical diagrams of the DIDO and DISO inverters are connected in the reinforced clock circuit resistant to single-particle transient in FIG. 5.

Figure 5:
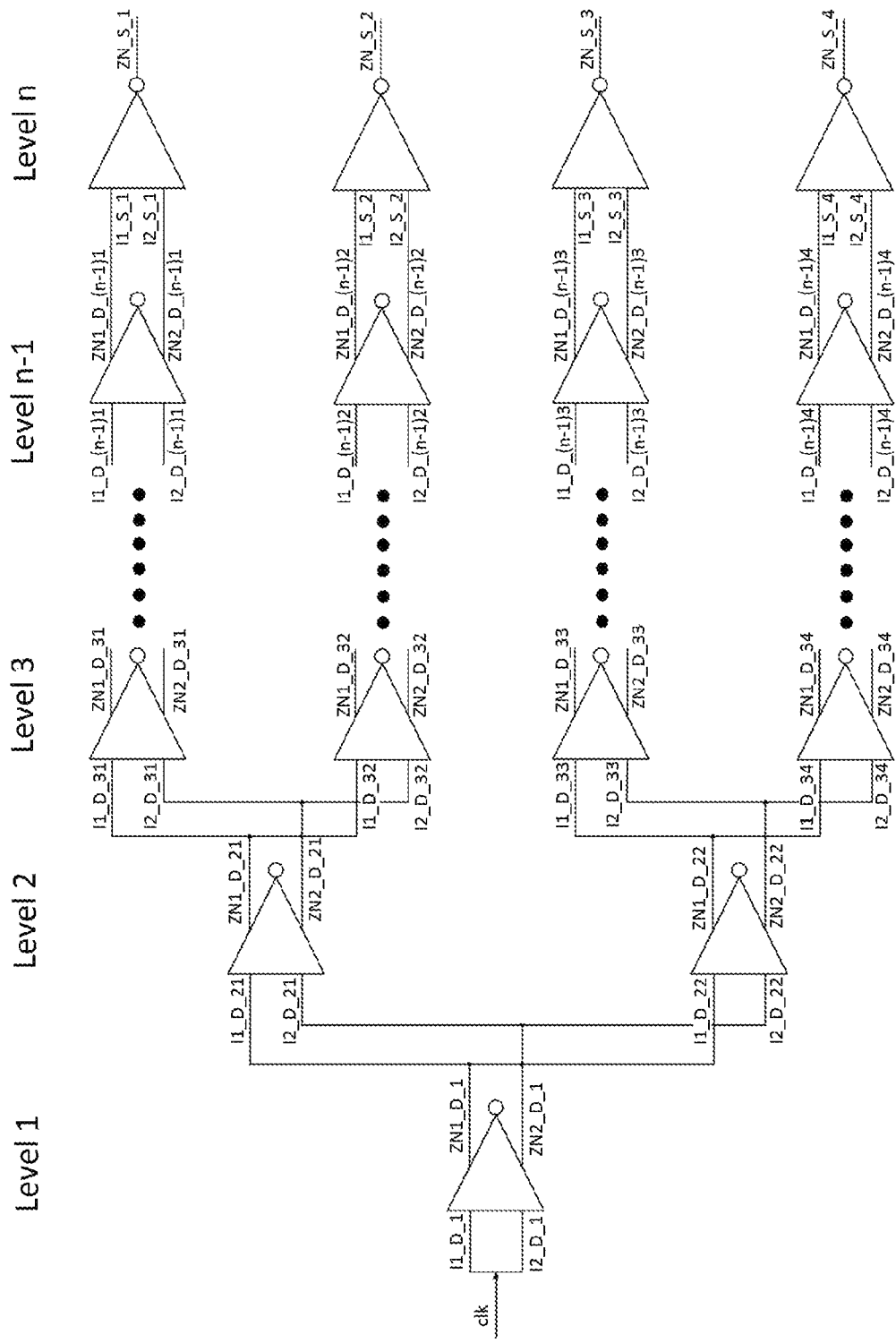
FIG. 5 is a schematic diagram of a reinforced clock circuit resistant to single-event transient, implemented using DIDO and DISO inverters.

FIG. 5 is a schematic diagram of a reinforced clock circuit resistant to single-event transient, implemented using DIDO and DISO units. In this embodiment, the clock driving circuit of the present invention is a clock network of a balanced tree structure composed of n levels of inverters. The Level 1 inverter to the Level (n−1) inverter are DIDO inverters, and the last level inverter, i.e., the Level n inverter, is a DISO inverter, wherein n is an integer, and the value of n is determined by the complexity of a designed circuit and a clock design scheme (including a topological structure of a clock distribution network) used by the designed circuit, n≥3. The two input ports of the Level 1 inverter are connected to the same clock signal clk, the output port ZN1_D_1 thereof is connected to the input ports I1_D_21 and I1_D_22 of the Level 2 inverter (in the Figure, two Level 2 inverters are connected as an example), and the output port ZN2_D_1 of the Level 1 inverter is connected to the input ports I2_D_21 and I2_D_22 of the Level 2 inverter; the output ports ZN1_D_21 and ZN1_D_22 of the two Level 2 inverters are respectively connected to the input ports I1_D_31, I1_D_32 and I1_D_33, I1_D_34 of the corresponding Level 3 inverters thereafter, and the output ports ZN2_D_21 and ZN2_D_22 thereof are connected to the input ports I2_D_31, I2_D_32 and I2_D_33, I2_D_34 of the third-stage inverters respectively. The output port ZN1_D_kj of the Level k inverter is connected to the input port I1_D_(k+1)j of the subsequent level inverter (i.e., the Level (k+1) inverter), and the output port ZN2_D_kj of the Level k inverter is connected to the input port I2_D_(k+1)j of the Level (k+1) inverter, wherein k and j are integers, 3≤k≤n−2, and 1≤j≤4. The last level inverter (i.e., the clock inverter directly connected to a timing unit such as a trigger, the Level n inverter) in the clock circuit is a DISO clock inverter: the two inputs ports I1_S_j and I2_S_j thereof are respectively connected to the output ports ZN1_D (n−1)j and ZN2_D (n−1)j of the penultimate level inverter (i.e., the Level (n−1) inverter), and the output port ZN_S_j thereof is connected to a clock input port of a timing unit such as a trigger connected.

Figure 6:
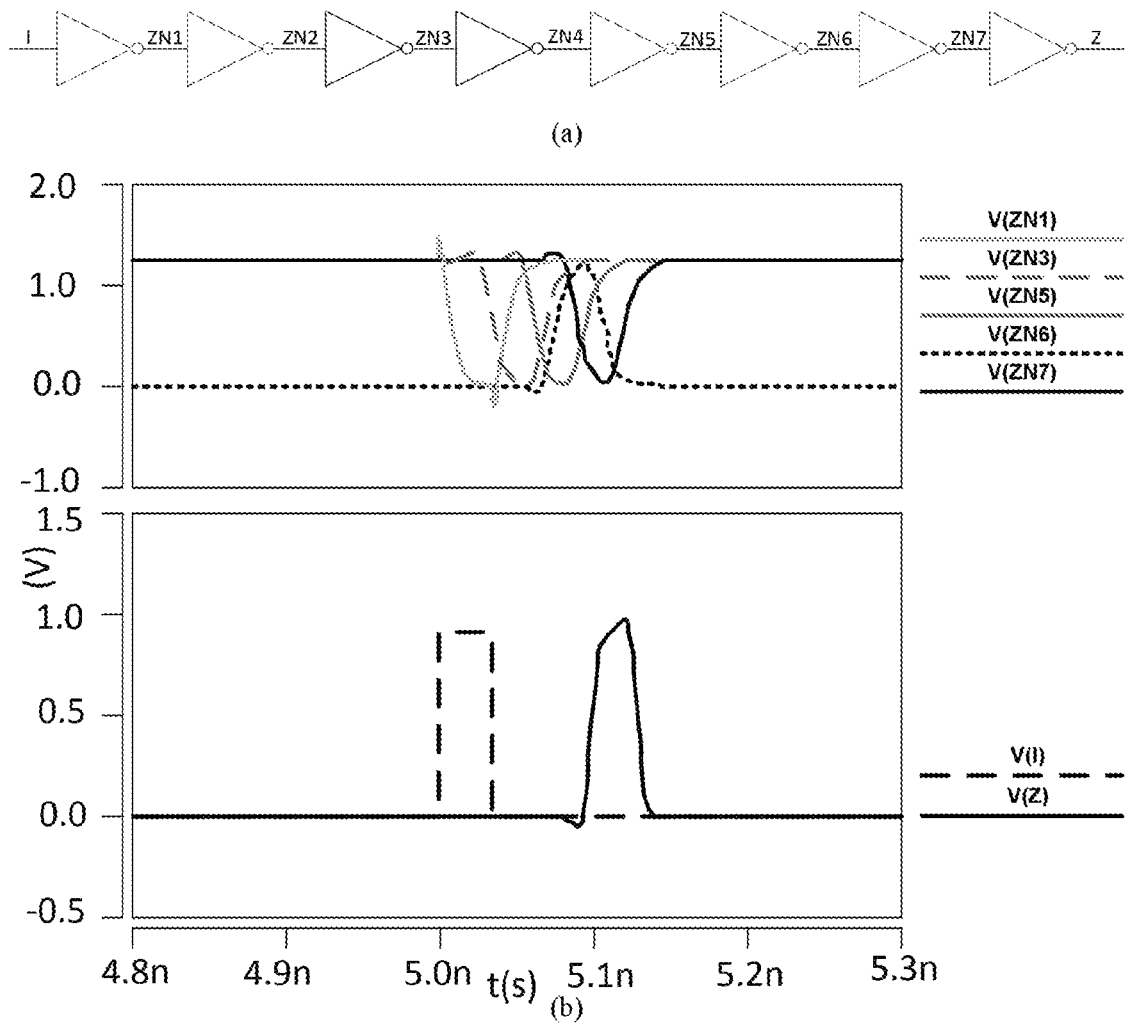
FIG. 6 is a schematic diagram showing an eight-level inverter chain composed of unreinforced clock inverters CLKNVHSV4 in a standard cell library under a general 65 nm process and propagation of a SET transient pulse therein according to a specific embodiment.

FIG. 6 is a schematic diagram showing an eight-level inverter chain composed of unreinforced clock inverters CLKNVHSV4 in a standard cell library under a general 65 nm process and propagation of a SET transient pulse therein according to a specific embodiment. FIG. 6(a) shows an inverter chain composed of unreinforced inverters CLKN-VHSV4 in a standard cell library under a general 65 nm process. The inverter chain is composed of eight clock inverters CLKNVHSV4 connected end to end, and the input and output ends of the inverter chain are I and Z, respectively. FIG. 6(b) is a schematic diagram showing propagation of a SET transient pulse in the inverter chain. The excitation of the SET pulse is applied to the input port I of the inverter chain. When the width of the applied SET pulse is small, the amplitude and width of the pulse are gradually reduced during propagation, and when the output end Z of the inverter chain is arrived at, the SET pulse cannot be captured. When the width of the applied SET pulse reaches about 35 ps, a rail-to-rail SET pulse signal can be captured at the output port Z.

Figure 7:
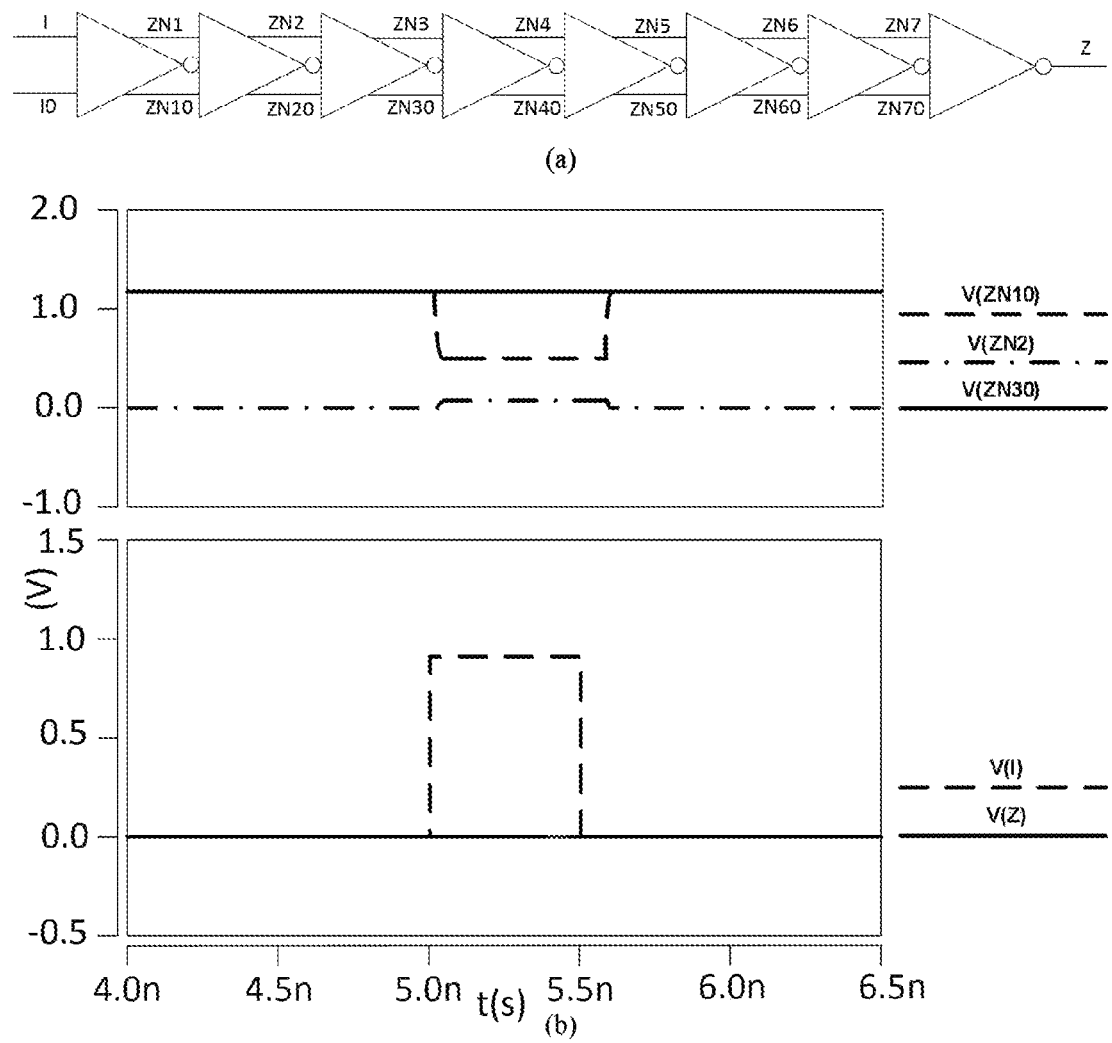
FIG. 7 is a schematic diagram showing an eight-level inverter chain composed of reinforced DIDO inverters CLKNVHSV4_DIDO and a DISO inverter CLKNVHSV4_DISO under a 65 nm process, and propagation of a SET transient pulse therein according to a specific embodiment.

FIG. 7 is a schematic diagram showing an eight-level inverter chain composed of reinforced DIDO inverters CLKNVHSV4_DIDO and a DISO inverter CLKNVHSV4_DISO under a 65 nm process, and propagation of a SET transient pulse therein according to a specific embodiment. FIG. 7(a) shows an inverter chain composed of two types of reinforced inverters connected end to end according to the present invention in a 65 nm process. The inverter chain includes seven DIDO inverters CLKNVHSV4_DIDO and a DISO inverter CLKNVHSV4_DISO. The input ports of the inverter chain are I and I0, and the output port is Z. FIG. 7(b) is a schematic diagram showing propagation of a SET pulse in the inverter chain. The input port I0 of the inverter chain is kept always 0, a SET pulse is added to the input port I, and propagation of the applied SET pulse in the inverter chain is learned by observing output waveforms of the output ends ZN* and ZN*0 (wherein *=1, 2 ... 7) of each inverter and the output end Z of the inverter chain. When the width of the applied SET pulse reaches 500 ps, no significant transient pulse is observed at the output end of the Level 3 inverter, in fact, at the output end of the Level 1 inverter, the amplitude of the pulse is already less than ½ of the amplitude of the applied SET pulse.

In order to illustrate the single-event transient resisting effect of the clock driving circuit resistant to single-event transient according to the present invention, a scalar memory controller decoding circuit is designed (including layout planning, clock tree synthesis, placement and routing, etc.) using the clock driving circuit of the present invention, an Encounter tool and a script; a detailed standard parasitic format (DSPF) file of the whole design is extracted using a parasitic parameter extraction tool StarRC; and a DSPF net list including resistance, capacitance and other detailed parasitic information is simulated using a Hspice tool.

Considering that the design of the scalar memory controller decoding circuit is mainly based on a trigger, simulation of radiation-induced clock race is mainly performed on the design in combination with the research results of N. Seifert et al. The injection position of the SET pulse traverses the output port of each DIDO inverter on the clock network during simulation; the injection time of the SET pulse is random (in a simulation time period, a random injection time is automatically generated using a shell script); the width of the SET pulse is random, and the width of the SET pulse is small than or equal to a maximum pulse width value (the maximum pulse width value is determined according to the test results of ground irradiation tests, and the pulse width is also generated automatically using a shell script). In the Spice net list, two identical decoding circuits are called; at the same time, the clock input port CK of the same timing unit (D trigger) in the two decoding circuits is connected to two input ports of an exclusive OR gate (i.e., the number of exclusive OR gates called during the simulation is equal to the total number of timing units in the decoding circuits). During the simulation, the SET pulse injection is traversed to the output ports of the DIDO inverters on the clock path in one decoding circuit, and propagation of the SET pulse on the clock path in the reinforced clock circuit resistant to single-event transient according to the present invention is researched by collecting statics on the number of high levels in exclusive OR gates (a group of exclusive OR gates connected to the CK end of the D trigger). The statistical results are shown in Table 1.

In order to verify the reinforcement effect of the reinforced clock circuit resistant to single-event transient according to the present invention more intuitively, clock tree synthesis is performed on the same design by using unreinforced clock inverters (CLKNVHSV1) having the same driving ability in the standard cell library to obtain an unreinforced clock distribution network. At the same time, traversal simulation is performed on the output ports of the inverters, corresponding to the respective DIDO inverters in the reinforced clock circuit resistant to single-event transient according to the present invention, on the unreinforced clock distribution network by using the simulation method described above. The simulation results are collected (the statistical results are shown in Table 1). Since a DISO inverter is adopted on the leaf node of the clock distribution network resistant to single-event transient according to the present invention, the output port ZN of such inverter bombarded also generates a SET pulse, and the pulse may be propagated to the trigger directly connected to the inverter. However, since the situation that the leaf node is bombarded and generates a SET pulse is similar to the situation of the leaf node on the unreinforced clock distribution network, it will not be simulated.

In order to make the verification result more sufficient, four traversal simulations are respectively performed on the output ports ZN1 of 31 DIDO inverters (CLKNVHSV1_DIDO) in the reinforced clock circuit resistant to single-event transient according to the present invention and the output ports ZN of 31 corresponding unreinforced common inverters (CLKNVHSV1) in the unreinforced clock distribution network. The design of a scalar memory controller decoding circuit includes 88 timing units (triggers), that is, the maximum number of SETs detected at the CK ports of the triggers is 88. Through the comparison of the statistical results in Table 1, it can be intuitively seen that the reinforced clock circuit resistant to single-event transient according to the present invention is obviously superior to a conventional unreinforced clock circuit in SET resistance, is suitable for a reinforced clock distribution network resistant to single-event transient, and therefore is applied in the fields of aviation, aerospace, etc.

TABLE 1

| Number of SETs detected at CK ends of triggers | Unreinforced clock circuit | Clock driving circuit resistant to single-event transient according to the present invention |
|---|---|---|
| 1-3 | 4 | 0 |
| 4-6 | 37 | 0 |
| 7-9 | 21 | 0 |
| 10-19 | 23 | 0 |
| 20-29 | 12 | 0 |
| 50-80 | 4 | 0 |
| 88 | 3 | 0 |

What is claimed is:

1. A clock driving circuit resistant to single-event transient, comprising:
   two types of inverters: a DIDO inverter and a DISO inverter;
   wherein the DIDO inverter includes a first input port, a second input port, a first output port and a second output port,
   wherein the DIDO inverter connects to a first PMOS transistor, a second PMOS transistor, a first NMOS transistor and a second NMOS transistor,
   wherein a gate of the first PMOS transistor is connected to the first input port of the DIDO inverter, a source of the first PMOS transistor is connected to a power supply, and a drain of the first PMOS transistor is connected to the first output port of the DIDO inverter,
   wherein a gate of the second PMOS transistor is connected to the second input port of the DIDO inverter, a source of the second PMOS transistor is connected to the power supply, and a drain of the second PMOS transistor is connected to the second output port of the DIDO inverter,
   wherein a gate of the first NMOS transistor is connected to the second input port of the DIDO inverter, a source of the first NMOS transistor is connected to the ground, and a drain of the first NMOS transistor is connected to the second output port of the DIDO inverter,
   wherein a gate of the second NMOS transistor is connected to the first input port of the DIDO inverter, a source of the second NMOS transistor is connected to the ground, and a drain of the second NMOS transistor is connected to the second output port of the DIDO inverter,
   wherein the DISO inverter includes a first input port, a second input and an output port,
   wherein the DISO inverter connects to a third PMOS transistor, a fourth PMOS transistor, a third NMOS transistor and a fourth NMOS transistor,
   wherein a gate of the third PMOS transistor is connected to the first input port of the DISO inverter, a source of the third PMOS transistor is connected to the power supply, and a drain of the third PMOS transistor is connected to a source of the fourth PMOS transistor,
   wherein a gate of the fourth PMOS transistor is connected to the second input port of the DISO inverter, the source of the fourth PMOS transistor is connected to the drain of the third PMOS transistor, and a drain of the fourth PMOS transistor is connected to the output port of the DISO inverter,
   wherein a gate of the third NMOS transistor is connected to the second input port of the DISO inverter, a source of the third NMOS transistor is connected to a drain of the fourth NMOS transistor, and a drain of the third NMOS transistor is connected to the output port of the DISO inverter,
   wherein a gate of the fourth NMOS transistor is connected to the first input port of the DISO inverter, a source of the fourth NMOS transistor is connected to the ground, and the drain of the fourth NMOS transistor is connected to the source of the third NMOS transistor.

2. The clock driving circuit resistant to single-event transient according to claim 1, wherein a number of the DIDO inverters and the DISO inverters is n, wherein n is an integer, wherein n is larger than or equal to 3, wherein the connection way is a balanced tree structure,
   wherein a Level 1 inverter to Level (n−1) inverters are the DIDO inverters, and last level inverters, i.e., Level n inverters, are the DISO inverters,
   wherein a first input port and a second input port of the Level 1 inverter are connected to a same clock signal, a first output port of the Level 1 inverter is connected to first input ports of Level 2 inverters, and a second output port of the Level 1 inverter is connected to second input ports of the Level 2 inverters, wherein first output ports of the two Level 2 inverters are respectively connected to first input ports of corresponding Level 3 inverters thereafter, and second output ports of the two Level 2 inverters are connected to second input ports of the Level 3 inverters respectively,
   wherein a first output port of a Level k inverter is connected to a first input port of a subsequent level inverter, and a second output port of a Level k inverter is connected to a second input port of a Level (k+1) inverter, wherein k and j are integers, $3 \leq k \leq n-2$, and $1 \leq j \leq 4$,
   wherein a first input and a second input of a Level n inverter thereof are respectively connected to a first output and a second output of the Level n−1 inverter, and an output port of the Level n inverter is connected to a clock input port of a timing unit such as a trigger connected.

* * * * *